United States Patent [19]

Tarutani et al.

[11] Patent Number: 5,424,281
[45] Date of Patent: * Jun. 13, 1995

[54] OXIDE-SUPERCONDUCTION GRAIN BOUNDARY TUNNELING DEVICE

[75] Inventors: Yoshinobu Tarutani, Yamanashi; Ushio Kawabe, Tokyo, both of Japan

[73] Assignee: Hitachi, Ltd., Tokyo, Japan

[*] Notice: The portion of the term of this patent subsequent to Mar. 30, 2010 has been disclaimed.

[21] Appl. No.: 9,082

[22] Filed: Jan. 26, 1993

Related U.S. Application Data

[63] Continuation of Ser. No. 790,085, Nov. 13, 1991, Pat. No. 5,198,413, which is a continuation of Ser. No. 214,462, Jul. 1, 1988, abandoned.

[30] Foreign Application Priority Data

Jul. 3, 1987 [JP] Japan .................. 62-165318

[51] Int. Cl.$^6$ .................. H01B 12/00; H01L 39/22
[52] U.S. Cl. .................. 505/190; 257/35; 257/36; 257/34; 505/233; 505/702; 427/62
[58] Field of Search .................. 257/33–35; 505/1, 702, 874, 861, 190–193, 220, 238, 329, 325; 427/62, 63

[56] References Cited

U.S. PATENT DOCUMENTS

| | | | |
|---|---|---|---|
| 4,578,691 | 3/1986 | Murakami et al. | 505/874 |
| 4,980,341 | 12/1990 | Gehring | 357/5 |
| 5,057,485 | 10/1991 | Nishino et al. | 357/5 |
| 5,198,413 | 3/1993 | Tarutani et al. | 257/34 |

FOREIGN PATENT DOCUMENTS

| | | | |
|---|---|---|---|
| 56-46580 | 4/1981 | Japan | 257/34 |
| 61-179585 | 8/1986 | Japan | 257/34 |

OTHER PUBLICATIONS

Chaudhari et al, "Critical–Current Measurements In Epitaxial Films Of YBaCuO Compound," Physical Review Letters, vol. 58, No. 25, 22 Jun. 1987, pp. 2684–2686.

Suzuki et al, "Temperature Dependence Of Maximum DC Josephson Current Through Grain Boundary Junctions In Ba Pb Bi O Films," Japanese Journal Of Applied Physics, vol. 21, No. 7, Jul. 1982, pp. L437–L439.

Hewat et al, "Superstructure Of Superconductor Bi Sr Ca Cu O By High-Resolution Electron Microscopy," Nature, vol. 333, 5 May 1988, pp. 53–54.

"Superconductivity And Related Properties Of Sulphur Substituted $YBa_2Cu_3O_{7-x}$", D. N. Mattews et al., Extended Abstracts, High-Temperature Superconductors Apr. 5–9 1988, pp. 377–380.

"Properties Of $La_{1-8}Sr_{0.2}CuO_4$ Superconductors", A. J. Panson et al., Appl. Phys. Lett. vol. 50, (16) 20 Apr. 1987, pp. 1104–1106.

"Oxygen Ordering In The Crystal Structure Of The 93-K Superconductor $YBa_2Cu_3O_7$ Using Powder Neutron Diffraction At 298 And 79.5K", J. E. Greedan et al., American Physical Society Physical Review B, vol. 35, #16, 1 Jun. 1987, pp. 8770–8773.

"Preparation Of $YBa_2Cu_3O_{7-x}$ Superconducting Thin Films By RF-Magnetron Sputtering", T. Aida et al, Japanese Journal Of Applied Physics, vol. 26, #9, Sep. 1987 pp. L1489–L1491.

"Evidence For Weak Link And Anisotropy Limitations On The Transport Critical Current In Bulk Polycrystalline $YiBa_2Cu_3O_x$", T. W. Ekin et al., Journal Of Appl. Phys., vol. 62, #12, 15 Dec. 1987, pp. 4821–4828.

(List continued on next page.)

Primary Examiner—Mahshid D. Saadat
Attorney, Agent, or Firm—Antonelli, Terry, Stout & Kraus

[57] ABSTRACT

An oxide-superconducting device comprises first and second electrodes of oxide-superconductor which are connected through a tunnel barrier layer. The oxide-superconductor is formed on a substrate having a recess, and it includes grain boundaries along the recess. The tunnel barrier layer is formed along the grain boundaries, and it is made of any material of an element F, Cl, Br, I, C, O, S, P or N, a mixture consisting of such elements, and a compound containing such an element, the material being introduced into the grain boundaries and/or lattice interstices near the grain boundaries.

8 Claims, 2 Drawing Sheets

OTHER PUBLICATIONS

Japanese Journal Of Applied Physics, vol. 26, No. 5, part 2, May 1987, pp. L701–L703, Tokyo *Abstract* Ext. Abst. High Temperature Superconductors, Proceedings Of Symposium S, Spring Meetings Of The Materials. Research Society, Anahem, 23rd–24th Apr. 1987, pp. 81–84, "Thin films and squids made from YBa2Cu3Oy".

Japanese Journal Of Applied Physics, vol. 24, part 1 Oct. 1985, pp. 1312–1315, Tokyo, JP; Y. Okabe et al.: "Josephson junctions with short semiconductor links separated by oxidized layer" * p. 1312, paragraph 3; Figure 1.

OXIDE-SUPERCONDUCTION GRAIN BOUNDARY TUNNELING DEVICE

CROSS REFERENCE TO RELATED APPLICATION

This application is a continuation application of Ser. No. 07/790,085, filed Nov. 13, 1992, now U.S. Pat. No. 5,198,413, which is a continuation application of Ser. No. 07/214,462, filed Jul. 1, 1988 (now abandoned).

BACKGROUND OF THE INVENTION

1. Field of the Invention

The present invention relates to the field of superconducting devices which are utilized as, e.g., switching elements for computers adapted to perform operations, storage, etc. at high speed. More particularly, it relates to an oxide-superconducting device which can operate at or above the liquid nitrogen temperature.

2. Description of the Related Art

A superconducting current coupling device in a prior art has a structure wherein a superconductor film for a base electrode, a tunnel barrier layer, and a superconductor film for a counter electrode are successively stacked. The tunnel barrier layer has usually been formed by oxidizing the surface layer of the base electrode film, by depositing a very thin layer of semiconductor or insulator film, or by depositing and then oxidizing a very thin layer of metal.

By way of example, in case of a superconducting current coupling device which employs Nb as its superconductor, an Al thin layer having a thickness of 3–10 nm is deposited en an Nb film as a base electrode and is oxidized, thereby to form a tunnel barrier layer. The structure and manufacturing method of such an Nb-type superconducting current coupling device are described in detail in "IEEE Transactions on Magnetics," MAG-19 (1983), pp. 791–794. Such an Nb-type superconducting current coupling device operates at, at most, 9 K being the critical temperature of Nb. In order to operate such an Nb-type device, cooling with liquid helium is required, and the equipment and cost of the cooling become enormous. In contrast, if a device capable of operating at a high temperature such as the liquid nitrogen temperature exists, it will be very advantageous from the viewpoints of the cooling cost and easy handling.

For fabricating a superconducting current coupling device of high operating temperature relative to the prior art stated above, a superconductor material of high critical temperature needs to be employed for electrode films. As the superconductor material of high critical temperature, an oxide having the perovskite type crystal structure, such as Ba—Y—Cu oxide, or an oxide having the modified structure thereof, for example, La—Ba—Cu oxide or Bi—Sr—Ca—Cu oxide, exhibits a high superconducting critical temperature of or above 90 K. When the Ba—Y—Cu oxide is used as the electrode material, the superconducting current coupling device which operates at a temperature up to 90 K is fabricated.

A thin film is employed as the electrode member of the superconducting current coupling device. A temperature for forming the thin film of the Ba—Y—Cu oxide is above 800° C. Assuming the electrode members of the Ba—Y—Cu oxide and a tunnel barrier layer made of an insulator or semiconductor and having a thickness of about 2 nm, let's consider the junction structure of the prior-art system wherein these layers are stacked vertically to a substrate. As the steps of fabrication for obtaining such a superconducting current coupling device adapted to operate at the high temperature, it is necessary to form the thin film of the Ba—Y—Cu oxide as the base electrode, to thereafter cover this thin film with the insulator or semiconductor to the thickness of about 2 nm, and to further form the thin film of the Ba—Y—Cu oxide as the counter electrode. In a case where the substrate is heated above 800° C. at the step of forming the Ba—Y—Cu oxide for the counter electrode, the semiconductor or insulator being 2 nm thick is destroyed by thermal diffusion. More specifically, it is impossible for a typical insulating ultrathin film of $SiO_2$, $Al_2O_3$ or the like to be free from pinholes and hold its insulating property even after the heat treatment at above 800° C. The reason is that, in the heating process, a diffusion reaction takes place between the Ba—Y—Cu oxide and the insulating oxide. It has accordingly been impossible to apply the prior-art method to the fabrication of the superconducting current coupling device of high temperature operation which employs the superconductor material of high critical temperature such as Ba—Y—Cu oxide.

SUMMARY OF THE INVENTION

An object of the present invention is to provide a superconducting current coupling device which can operate at a high temperature (for example, the liquid nitrogen temperature or above).

To the accomplishment of the above object, technical expedients to be described below are adopted: In a superconducting current coupling device wherein an oxide-superconductor material is used for electrodes, superconductor electrodes on both sides are made of an oxide of a polycrystal of uniform crystal orientations or a single crystal. In a partial region of the oxide crystal, an element F, Cl, Br, I, C, O, S, P or N, a mixture consisting of such elements, or an organic substance containing such an element is introduced into lattice interstices or grain boundaries, thereby to form a tunnel barrier layer.

Such an oxide-superconducting device is formed by a method as stated below: A single crystal of $SrTiO_3$, for example, is employed as the material of a substrate. The (100)-plane of the $SrTiO_3$ crystal is set to be parallel to the plane of the substrate. A Ba—Y—Cu oxide, for example, is grown thereon, and the oxide crystal is controlled so that its c-axis may be directed perpendicular to the substrate plane. An element F, Cl, Br, I, C, O, S, P or N, a mixture consisting of such elements, or a compound or organic substance containing such an element is introduced into the lattice interstices or grain boundaries of the Ba—Y—Cu oxide through a resist pattern. The atoms or molecules of the element or elements are introduced so as to reach the rear surface of the thin film of the Ba—Y—Cu oxide, namely, the substrate side. The part where the atoms or molecules of the element or elements have been introduced, is utilized as the tunnel barrier layer. The superconducting current coupling device is fabricated by the above steps.

The structure and manufacturing method of the oxide-superconducting device as described above solve the problem of the prior art on the following ground:

In the case where, as in the superconducting current coupling device of the prior art, the counter electrode film is formed under the condition of the high substrate temperature after the formation of the tunnel barrier layer, obviously the tunnel barrier layer is degraded by the thermal diffusion. In the oxide-superconducting current coupling device according to the present invention, the tunnel barrier layer is formed after the formation of the electrode film. Accordingly, there is not involved the problem that the tunnel barrier layer is degraded by the succeeding step of fabrication.

The oxide-superconductor material serving as the electrode material of the oxide-superconducting device has a structure which contains the vacancies of oxygen atoms in a large amount. By way of example, the crystal structure of the Ba—Y—Cu oxide is shown in FIG. 1. In this structure, the proportion of the oxygen defects with respect to the fundamental perovskite type crystal structure is 25%. Quite no oxygen atom 2 exists in a plane perpendicular to the c-axis along which atoms Ba—Y—Ba are arrayed, the plane containing the Y atom 4. In a plane which contains the middle point between the Y atom 4 and the Ba atom 3 or 3', oxygen atoms are defective in a proportion of 62.5%. As regards the crystal structure containing such vacancies of the oxygen atoms 2, accordingly, the reaction of introducing into lattice interstices an element F, Cl, Br, I, C, O, S, P or N, a mixture consisting of such elements, or a compound or organic substance containing such an element is comparatively easy of proceeding. The reaction of introducing into grain boundaries such an element, the mixture consisting of such elements, or the organic substance containing such an element is still easier of proceeding.

According to the present invention, the following effects are produced as to an oxide-superconducting device:

(1) An operation at the liquid nitrogen temperature is possible, and the reduction of a cost and the simplification of an equipment required for the cooling of the device are attained.

(2) Since a tunnel barrier layer is formed after the formation of bilateral electrode films, the problem of the degradation of the barrier layer during a fabricating process is not involved, and the superconducting device of high quality is fabricated.

(3) Since the bilateral electrode films are formed by one time of film formation, the process is simplified, and the structure of the device becomes simple.

In this way, a switching element, a highly-sensitive magnetic flux detector or a highly-sensitive microwave or infrared detector which utilizes the superconducting phenomenon is readily permitted to operate at the room temperature.

These and other objects and many of the attendant advantages of this invention will be readily appreciated as the same becomes better understood by reference to the following detailed description when considered in connection with the accompanying drawings.

DETAILED DESCRIPTION OF THE PREFERRED EMBODIMENTS

Now, the present invention will be described in conjunction with the ensuing embodiments.

Figure 1:
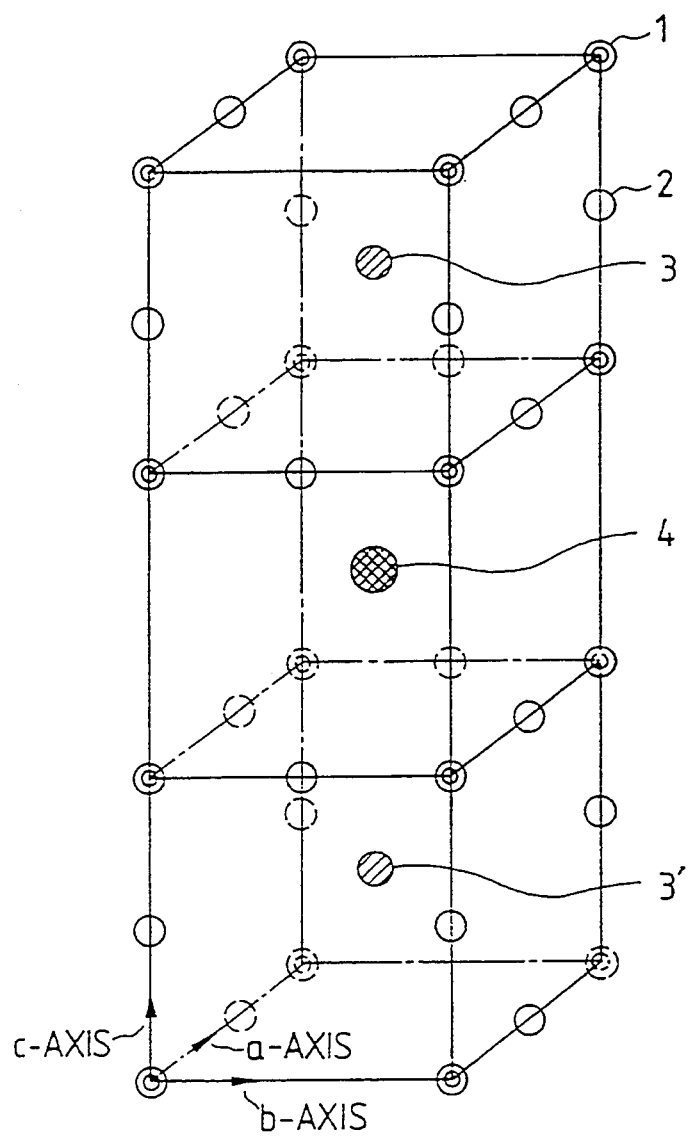
FIG. 1 is a view showing the atomic arrayal of a Ba—Y—Cu oxide.
Figure 2A:
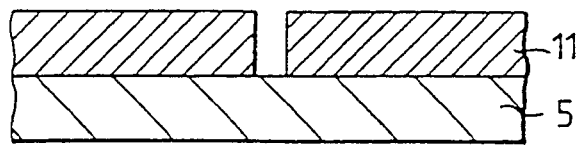
FIGS. 2A–2F are views showing the fabricating steps of an oxide superconducting device which is an embodiment of the present invention.
Figure 2B:
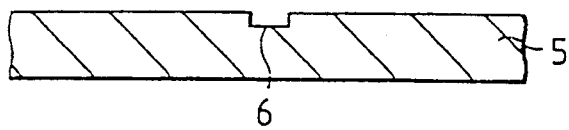
Figure 2C:
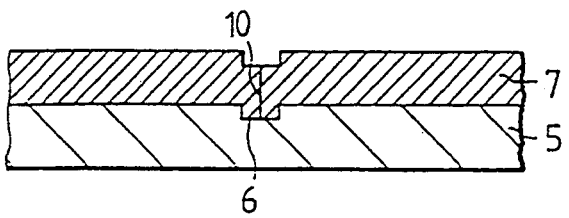

The single crystal of $SrTiO_3$ 5 is employed as a substrate. The substrate is so set that the (100)-plane of the crystal becomes parallel to the plane of the substrate. The substrate is formed with a recess 6 of submicron width. The recess 6 is formed to be perpendicular to the direction of the flow of current, and to be rectilinear. Grain boundaries are caused to exist along this recess 6. In forming the recess 6, a resist pattern 11 which has a slit of submicron width as shown in FIG. 2A is formed, and the resultant substrate is irradiated with an argon beam at a voltage of 500 V. Thereafter, the resist pattern 11 is removed. Thus, the recess 6 as shown in FIG. 2B is formed. The width of the recess 6 is set within 0.5 $\mu$m, and the depth thereof is set at 10 nm. A Ba—Y—Cu oxide 7 is formed on the substrate 5 subjected to such processing (FIG. 2C). That is, the thin film of the Ba—Y—Cu oxide in which the composition ratio among Ba, Y and Cu becomes 2:1:3 is formed on the $SrTiO_3$ substrate 5. The Ba—Y—Cu oxide film is formed by RF magnetron sputtering with a Ba—Y—Cu oxide target. The temperature of the substrate during the formation of the film is set within 400° C. The thickness of the film is set at 500 nm. The deposition rate thereof is set at 10 nm/min. After the formation of the film, annealing within a temperature range of 800° C.–1000° C. is carried out in an oxygen atmosphere, whereby the Ba—Y—Cu oxide is crystallized. According to the result of an X-ray diffraction measurement, the crystal structure of a Ba—Y—Cu oxide 7 formed on an $SrTiO_3$ substrate 5 under the same conditions is the modified structure of a perovskite type crystal as illustrated in FIG. 1, and the c-axis thereof exhibits an orientation perpendicular to the plane of the film. According to the result of an observation with a scanning electron microscope, the grain diameters of the Ba—Y—Cu oxide 7 in electrode portions are 3 $\mu$m or greater. Regarding the part of the oxide 7 where the $SrTiO_3$ substrate was irradiated with the argon beam, grain boundaries 10 are continuous is the direction of the recess 6.

Figure 2D:
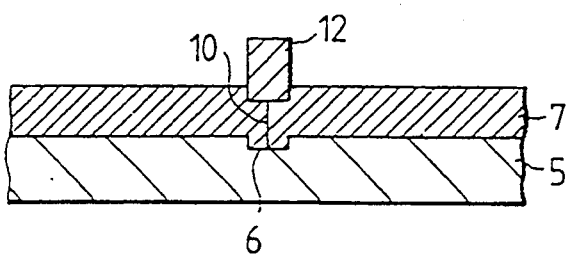
Figure 2E:
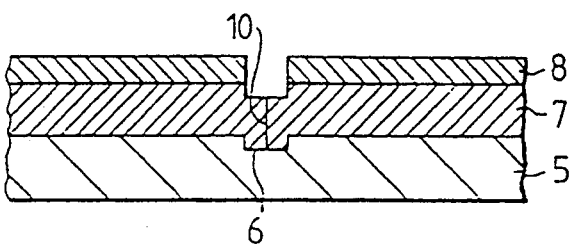

Subsequently, as shown in FIG. 2D, a resist pattern 12 is formed on the part of the Ba—Y—Cu oxide 7 corresponding to the recess 6. A platinum (Pt) film 8 is formed on the part outside the resist. The thickness of the Pt film 8 is set at 200 nm. After the formation of the Pt film, the resist material is immersed in an acetone solvent and is removed, thereby to obtain a structure as shown in FIG. 2E. The thin film of the Ba—Y—Cu oxide 7 is put in a vacuum apparatus, and a carbon (C) film 9 is formed thereon by RF magnetron sputtering. The thickness of the C film 9 is set at 20 nm. After the formation of the C film 9, the thin film of the Ba—Y—Cu oxide 7 is annealed at 30° C.–700° C. in the air, thereby to form the tunnel barrier layer 10. Then, an oxide-superconducting current coupling device as shown in FIG. 2F is finished up.

Figure 3:
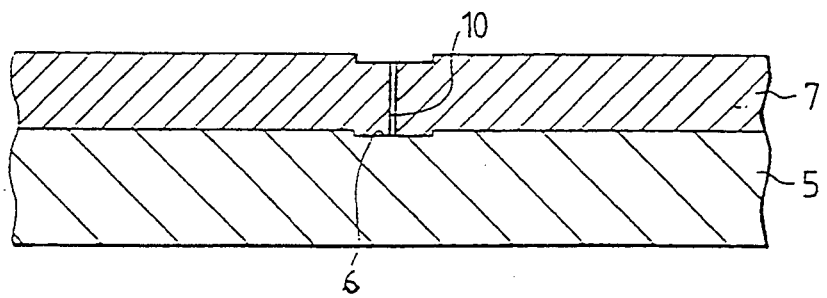
FIG. 3 is a view showing the sectional structure of a superconducting current coupling device which is an embodiment of the present invention.
Figure 2F:
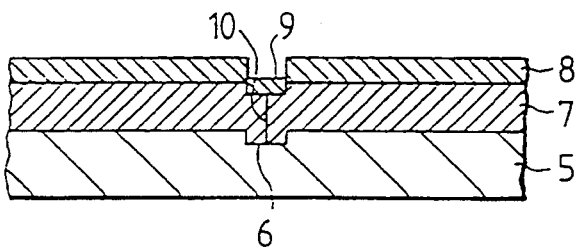

In the superconducting current coupling device of FIG. 2F, the Pt film 8 and the C film 9 are depicted. However, they are left behind the process of manufacture, and they need not exist. A device which does not include these films is shown in FIG. 3. In this device, the Pt film 8 and the C film 9 have been removed by inverse sputtering.

The characteristics of the Ba—Y—Cu superconducting current coupling device fabricated as described above are measured by immersing the device in liquid nitrogen. The voltage-current characteristics of the superconducting current coupling device exhibit characteristics as a typical superconducting current coupling device. The superconducting critical current reaches a practically required value of at least 100 $\mu$A. It exhibits a periodical dependency upon a magnetic field, and this reflects a peculiarity to the superconducting current coupling device.

Even in a case where, for the tunnel barrier layer of the oxide-superconducting device, an element F, Cl, Br, I, O, S, P or N other than C, a mixture consisting of such elements including C, or a compound or organic substance containing such an element including C is introduced into lattice interstices or grain boundaries, similar results are obtained. Even in a case where an oxide-superconductor material other than the Ba—Y—Cu oxide, such as a Ba—Y—Cu oxide containing fluorine (F), an La—Sr—Cu oxide or a Bi—Ca—Sr—Cu oxide is employed as the electrode material, results are similar. Using the oxide-superconductor electrodes of uniform crystal orientations, it is possible to obtain a structure in which crystal grains are columnar and in which the grain boundaries are continuously joined down to the surface of the substrate. The reason is that a polycrystal of uniform crystal orientations is, in general, more liable to become columnar crystals. With such a grain boundary structure, it is easy that the element C, F, Cl, Br, I, O, S, P or N, the mixture consisting of such elements, or the compound or organic substance containing such an element is introduced along the grain boundaries. This situation is similar also in the case of the introduction into the lattice interstices. However, the aforementioned material enters preferentially along the grain boundaries rather than into the lattice interstices. Therefore, a single-crystal thin film need to be employed for introducing the material into the lattice interstices.

What is claimed is:

1. An oxide-superconductor device comprising:
    a substrate;
    first and second electrodes which are made of an oxide-superconductor film formed on the substrate, the oxide-superconductor film having a crystal structure, the c-axis of the crystal structure being directed perpendicular to the plane of the substrate; and
    a tunnel barrier layer which is formed between the first and second electrodes, and which is made of a member selected from the group consisting of any of elements F, Cl, Br, I, C, O, S, P and N, a mixture consisting of such elements, a compound containing such an element, and an organic substance containing such an element, said member being introduced into at least one of lattice interstices and grain boundaries of the crystal structure between the first and second electrodes.

2. An oxide-superconductor device according to claim 1, wherein the substrate has its (100)-plane held in parallel with the substrate plane.

3. An oxide-superconductor device according to claim 1, wherein the oxide-superconductor device is operated at or above the liquid nitrogen temperature.

4. An oxide-superconductor according to claim 1, wherein the first and second electrodes are made of an oxide selected from a group consisting of a polycrystal of uniform crystal orientations and a single crystal.

5. An oxide-superconductor device according to claim 1, wherein the substrate is made of $SrTiO_3$.

6. An oxide-superconductor device according to claim 1, wherein the oxide-superconductor film has a perovskite crystal structure.

7. An oxide-superconductor device according to claim 1, wherein the substrate has a stepped portion.

8. An oxide-superconductor device according to claim 1, wherein the substrate has a recess.

* * * * *